(12) United States Patent
Kumar et al.

(10) Patent No.: US 9,357,632 B1
(45) Date of Patent: May 31, 2016

(54) APPARATUS, SYSTEM, AND METHOD FOR REDUCING INTERFERENCE BETWEEN CLOCK SIGNALS

(71) Applicant: Juniper Networks, Inc., Sunnyvale, CA (US)

(72) Inventors: K. Rajeev Kumar, Andhra Pradesh (IN); Nagaraj. A, Karnaktaka (IN)

(73) Assignee: Juniper Networks, Inc., Sunnyvale, CA (US)

( * ) Notice: Subject to any disclaimer, the term of this patent is extended or adjusted under 35 U.S.C. 154(b) by 448 days.

(21) Appl. No.: 13/866,289

(22) Filed: Apr. 19, 2013

(51) Int. Cl.
*H05K 1/02* (2006.01)

(52) U.S. Cl.
CPC .................................... *H05K 1/0228* (2013.01)

(58) Field of Classification Search
CPC . H05K 1/0228; H05K 1/0224; H05K 9/0039; H01J 2211/446
See application file for complete search history.

(56) References Cited

U.S. PATENT DOCUMENTS

| | | | |
|---|---|---|---|
| 7,217,889 B1 * | 5/2007 | Parameswaran et al. | 174/261 |
| 2002/0139568 A1 * | 10/2002 | Ross et al. | 174/252 |
| 2007/0123298 A1 * | 5/2007 | Zhu et al. | 455/553.1 |
| 2007/0176692 A1 * | 8/2007 | Chen | 331/16 |
| 2010/0096174 A1 * | 4/2010 | Nakano et al. | 174/260 |
| 2011/0203843 A1 * | 8/2011 | Kushta | 174/377 |
| 2011/0317475 A1 * | 12/2011 | Suwa et al. | 365/149 |
| 2013/0215588 A1 * | 8/2013 | Kawai | 361/783 |

* cited by examiner

*Primary Examiner* — Hoa C Nguyen
*Assistant Examiner* — Keith Depew
(74) *Attorney, Agent, or Firm* — ALG Intellectual Property, LLC

(57) ABSTRACT

An apparatus for reducing interference between clock signals may include a circuit board and a first set of clock vias coupled to the circuit board. The apparatus may also include a second set of clock vias coupled to the circuit board in a linear pattern adjacent to the first set of clock vias. The first set of clock vias may transmit a first clock signal and the second set of clock vias may transmit a second clock signal with a frequency that is different from the first clock signal. The system may further include a ground via coupled to the circuit board in line with the second set of clock vias. Each ground via coupled to the circuit board may be positioned outside any region of the circuit board located between the first and second sets of clock vias. Various other apparatuses, systems, and methods are also disclosed.

20 Claims, 11 Drawing Sheets

APPARATUS, SYSTEM, AND METHOD FOR REDUCING INTERFERENCE BETWEEN CLOCK SIGNALS

BACKGROUND

Circuit boards may include a variety of components that are positioned in close proximity to each other. To address the need for more compact and powerful computing systems, circuit board manufacturers may fit an increasing number of components on a circuit board. An increase in the density of components on a circuit board may result in an increased potential for disruptive interference between components.

Some interference may be caused by electromagnetic fields generated when oscillating signals are transmitted through components of a circuit board. An electromagnetic field generated by a signal carried by one component may result in interference in signals carried by nearby components. The degree of interference created between two components may be a function of, among other things, how closely the components are positioned on a circuit board.

Interference may be particularly problematic when clock components interfere with one another (e.g., via cross-talk coupling). This problem may be exacerbated when cross-talk coupling is between clock signals with frequencies that produce similar harmonics. For example, if a first clock signal is offset from a second clock signal by an offset frequency, the first and second clock signals may produce harmonics that create spurs at the offset frequency. Such spurs may violate phase noise specifications of a circuit board and result in malfunction of components that rely on the clock signals.

SUMMARY

As will be described in greater detail below, the instant disclosure generally relates to systems, methods, and apparatuses for reducing interference between clock signals. In one example, an apparatus for reducing interference between clocks signals may include a circuit board and a first set of clock vias that are coupled to the circuit board. The first set of clock vias may transmit a first clock signal. The apparatus may also include a second set of clock vias that transmit a second clock signal that cycles at a frequency that is different from a frequency of the first clock signal. The second set of clock vias may be coupled to the circuit board in a linear pattern adjacent to the first set of clock vias. The apparatus may further include at least one ground via coupled to the circuit board in line with the second set of clock vias. Each ground via coupled to the circuit board, including the at least one ground via, may be positioned outside any region of the circuit board located between the first and second sets of clock vias.

As another example, a method for reducing interference between clock signals may include creating a first virtual ground between first and second adjacent clock vias on a circuit board by transmitting a differential clock signal through the first and second clock vias. The method may also include transmitting an additional clock signal through a third clock via that is coupled to the circuit board adjacent to the first and second clock vias. The additional clock signal may cycle at a frequency that is different from a frequency of the differential clock signal. The method may further include grounding a first ground via that is coupled to the circuit board adjacent to the first clock via such that the first ground via reduces at least a portion of an electromagnetic field that is generated by the first clock via but not cancelled in the first virtual ground, where each ground via coupled to the circuit board, including the first ground via, may be positioned outside any region of the circuit board located between the first, second, and third clock vias.

In various embodiments, a system for reducing interference between clock signals may include a first clock that generates a first clock signal and a second clock that generates a second clock signal that cycles at a frequency that is different from a frequency of the first clock signal. The system may also include a circuit board, a first set of clock vias communicatively coupled to the first clock and coupled to the circuit board, and a second set of clock vias communicatively coupled to the second clock and coupled to the circuit board in a linear pattern adjacent to the first set of clock vias. The system may further include at least one ground via coupled to the circuit board in line with the second set of clock vias. Each ground via coupled to the circuit board, including the at least one ground via, may be positioned outside any region of the circuit board located between the first and second sets of clock vias.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
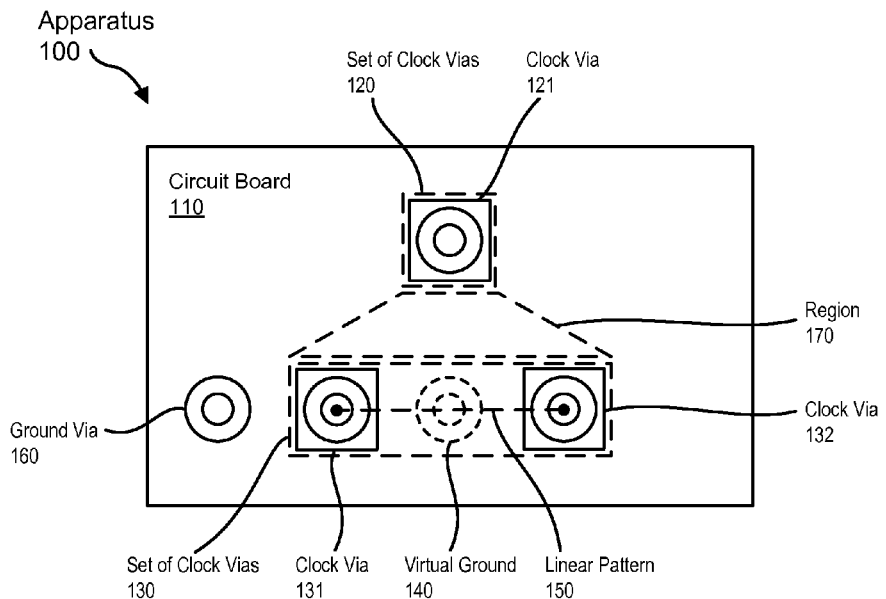
FIG. 1 is a block diagram of an exemplary apparatus for reducing interference between clock signals.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure is generally directed to reducing interference between clock signals. As will be explained in greater detail below, embodiments of the instant disclosure may use strategic ground via placement to reduce cross-talk coupling between adjacent clock vias. For example, ground vias may be positioned in locations where they will reduce interference that may not be eliminated by a virtual ground (i.e., a ground return created by electromagnetic fields that cancel out each other). Placing ground vias in this manner may limit the number of physical ground vias needed to reduce clock signal cross-talk coupling to an acceptable level, which may be useful in a variety of situations (e.g., on high-density circuit boards).

The following will provide, with reference to FIGS. 1-5, examples of circuit board component placement (e.g., ground via and clock via placement) that may result in a reduction of clock signal interference. Detailed descriptions of exemplary clock via electromagnetic field interaction and reduction will be provided in connection with FIG. 6. In addition, the discussion corresponding to FIG. 7 will provide detailed descriptions of exemplary clock and clock-buffer configurations for the clock vias shown in FIGS. 1-5. The discussion corresponding to FIG. 8 will provide a detailed description of an exemplary method for reducing clock signal interference. Furthermore, detailed descriptions of exemplary circuit diagrams of clock termination schemes capable of implementing the method shown in FIG. 8 will be provided in connection with FIG. 9. Phase noise test results for the exemplary termination schemes shown in FIG. 9 will be provided in connection with FIGS. 10 and 11. Finally, the discussion corresponding to FIG. 12 will provide numerous examples of systems that may include the components and circuits shown in FIGS. 1-5, 7, and 9.

FIGS. 1-5 show block diagrams of an exemplary apparatus 100 for reducing clock signal interference. Apparatus 100 may include a circuit board 110. The phrase "circuit board" may generally refer to any type or form of insulating material suitable for mounting (e.g., mechanical support) and/or interconnection (e.g., electrical coupling) of electronic components. Circuit board 110 may include a single-sided board, a double-sided board, a multi-layered board, a line card, a motherboard, a backplane, a midplane, and/or any other type or form of circuit board. Various components may be laminated, etched, attached, and/or otherwise coupled to circuit board 110.

FIG. 1 shows that a first set of clock vias 120, which may include a clock via 121, may be coupled to circuit board 110. A second set of clock vias 130, which may include clock vias 131 and 132, may also be coupled to circuit board 110. The term "via" may generally refer to any type or form of electrical connection on a circuit board, including through holes, blind vias, and/or buried vias. For example, a via may provide an electrical connection between layers in an electronic circuit on a circuit board. The phrase "clock via" may generally refer to any type or form of via that transmits a clock signal.

Clock via 121 may transmit a first clock signal, and clock vias 131 and 132 may transmit a second clock signal. The phrase "via that transmits a clock signal" may generally refer to any via that is capable of transmitting (e.g., designed and/or manufactured to transmit) a clock signal and/or that is currently transmitting a clock signal. The phrase "clock signal" may generally refer to any type or form of oscillating signal used to coordinate one or more actions of a circuit.

A clock signal transmitted by clock via 121 may cycle at a first frequency and a clock signal transmitted by clock vias 131 and 132 may cycle at a second frequency that is different from the first frequency. In the example shown in FIG. 1, clock via 121 may transmit a single-ended clock signal at one frequency and clock vias 131 and 132 may transmit a differential clock signal (e.g., a two-ended clock signal) at another frequency. A differential clock may include two parts: a first signal and a second signal that is a phase-shifted or offset (e.g., by 180 degrees) copy of the first signal. When active, the differential clock signal on clock vias 131 and 132 may create a virtual ground 140 between clock via 131 and clock via 132.

Sets of clock vias 120 and 130 may transmit clock signals having any suitable frequency. For example, sets of clock vias 120 and 130 may transmit clock signals that oscillate in the kilohertz (kHz) range, the megahertz (MHz) range, the gigahertz (GHz) range, and/or the terahertz (THz) range.

FIG. 1 shows that clock vias 131 and 132 may be arranged in a linear pattern 150. The phrase "linear pattern" refers to any pattern of one or more components that are arranged in a generally linear manner (e.g., a line) and/or repeat in a generally linear manner. In some embodiments, clock vias in a linear pattern may be collinear. Alternatively, clock vias in a linear pattern may be substantially positioned along or around a line without being collinear.

FIG. 1 also shows a ground via 160 that may be coupled to circuit board 110 in line with clock vias 131 and 132. The phrase "in line with" refers to a component that is arranged in a generally linear manner with a set of additional components. For example, ground via 160 may be collinear with set of clock vias 130, as shown in FIG. 1. Alternatively, ground via 160 may be substantially positioned along or around (e.g., in close physical proximity of) a line extending from linear pattern 150 without being collinear with linear pattern 150.

Ground via 160 may be positioned any suitable distance from set of clock vias 130. For example, ground via 160 may be positioned in close physical proximity to clock via 131 (e.g., a distance between ground via 160 and clock via 131 may be less than a diameter of ground via 160, less than a width of clock via 131, less than 100 mils, etc.). Alternatively, ground via 160 may be positioned away from clock via 131 (e.g., a distance between ground via 160 and clock via 131 may be greater than a diameter of ground via 160, greater than a width of clock via 131, greater than 100 mils, etc.).

Ground via 160 may be grounded to a circuit of circuit board 110. When ground via 160 is grounded and clock vias 121, 131, and 132 carry an active clock signal, ground via 160 may reduce the electromagnetic interference created by clock vias 121, 131, and/or 132. Thus, ground via 160, along with virtual ground 140, may reduce interference between the clock signal on clock via 121 and the clock signal on clock vias 131 and 132. By reducing the interference between these clock signals, ground via 160 and virtual ground 140 may improve the integrity of the clock signals carried by sets of clock vias 120 and 130, even without any ground via on circuit board 110 being positioned between the first and second sets of clock vias.

In FIG. 1, each ground via on circuit board 110 is positioned outside any region of circuit board 110 that is located between sets of clock vias 120 and 130. For example, every ground via (i.e., ground via 160) of circuit board 110 may be positioned outside any region of circuit board 110 (e.g., region 170) between sets of clock vias 120 and 130. In other words, all ground vias on circuit board 110 may be positioned such that none of the ground vias on circuit board 110 are located between sets of clock vias 120 and 130.

Region 170 generally represents any area between set of clock vias 120 and set of clock vias 130. Region 170 may be triangular, squared, rectangular, quadrilateral, trapezoidal, rhomboidal, and/or may have any other suitable shape. As show in FIG. 1, region 170 may be bounded by lines between clock vias 121, 131, and 132. In other words, region 170 may be bounded by set of clock vias 120 and set of clock vias 130. Region 170 may also be bounded in any other manner that includes the entirety of and/or a substantial portion of an area of circuit board 110 located between set of clock vias 120 and set of clock vias 130.

In some embodiments (e.g., on high-density circuit boards), region 170 may be smaller than an area needed to place a ground via. For example, distances between clock vias 121, 131, and/or 132 may be smaller than a distance needed to place a ground via between any of clock vias 121, 131, and/or 132. Additionally or alternatively, a distance between sets of clock vias 120 and 130 may be smaller than a distance needed to place a ground via between sets of clock vias 120 and 130. In other embodiments, region 170 may be large enough for placement of one or more ground vias but may be unsuitable for ground via placement for some other reason (e.g., region 170 may be needed for placement of other components).

Figure 2:
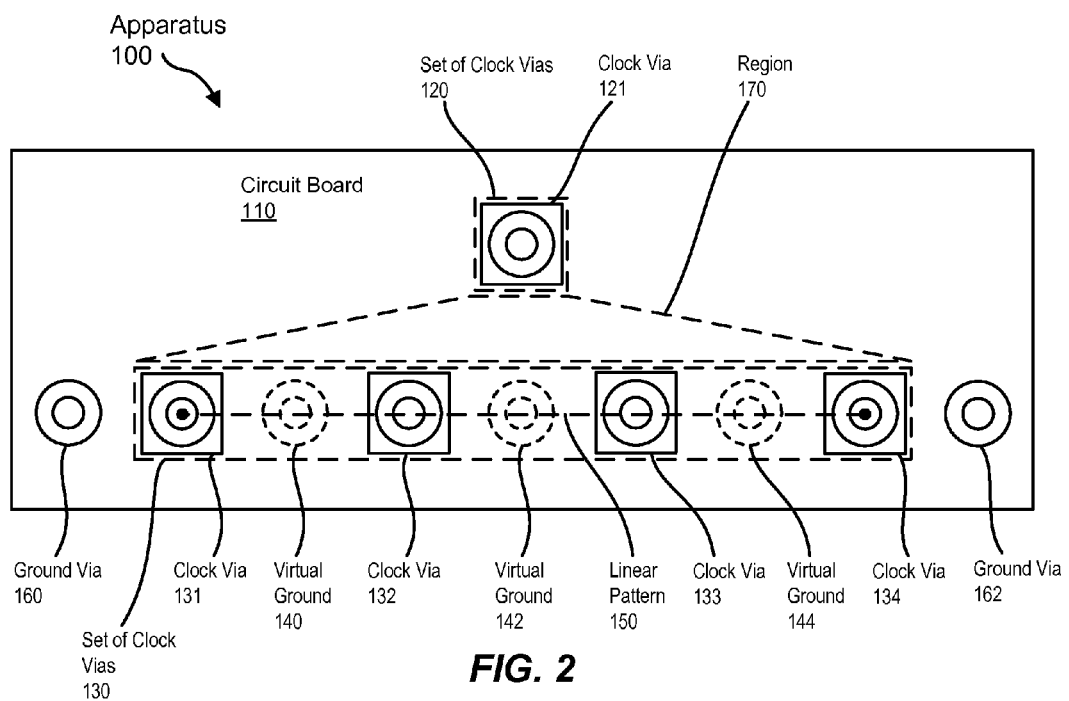
FIG. 2 is a block diagram of an exemplary apparatus for reducing interference between clock signals.

FIG. 2 shows that apparatus 100 may include two additional clock vias, 133 and 134, coupled to circuit board 110. In FIG. 2, clock vias 131-134 may form linear pattern 150. FIG. 2 also shows an additional ground via 162 coupled to circuit board 110 adjacent to clock via 134 and in line with set of clock vias 130. In other words, ground via 162 may be coupled to circuit board 110 adjacent to the end clock via (i.e., clock via 134) in linear pattern 150. Similarly, ground via 160 may be said to be coupled to circuit board 110 adjacent to a beginning clock via (i.e., clock via 131) in linear pattern 150.

Clock vias 131-134 may transmit two copies of a differential clock signal. For example, clock vias 131 and 132 may transmit a first copy of a differential clock signal, with clock via 131 carrying a positive signal of the differential clock and clock via 132 carrying a negative signal of the differential clock. Similarly, clock vias 133 and 134 may transmit a second copy of the differential clock signal, with clock via 133 carrying a positive signal of the differential clock and clock via 134 carrying a negative signal of the differential clock. In other words, the signals carried on clock vias 131-134 may be copies of the same clock signal (i.e., clock signals with the same or substantially the same frequency and amplitude) with alternating polarities. As a result of the alternating polarities of the signals transmitted by clock vias 131-134, electromagnetic fields generated by clock vias 131-134 may cancel each other out at points between clock vias 131-134, thereby creating virtual grounds 140, 142, and 144.

Due to the arrangement of ground vias 160 and 162 on either side of set of clock vias 130, as well as the arrangement and alternating polarities of clock vias 131-134, each clock via in set of clock vias 130 may be positioned between and adjacent to two physical or virtual grounds. The physical and virtual grounds positioned on either side of each of clock vias 131-134 may reduce interference caused by clock vias 131-134 to an acceptable level (e.g., to a level that does not cause a clock signal on clock via 121 to violate a phase noise specification). In some embodiments, the physical and virtual grounds shown in FIG. 2 may substantially or completely eliminate interference caused by signals on clock vias 131-134. These grounds may also shield clock vias 131-134 from interference from other clock signals (e.g., the clock signal transmitted by clock via 121) or other interference from other components on circuit board 110.

Figure 3:
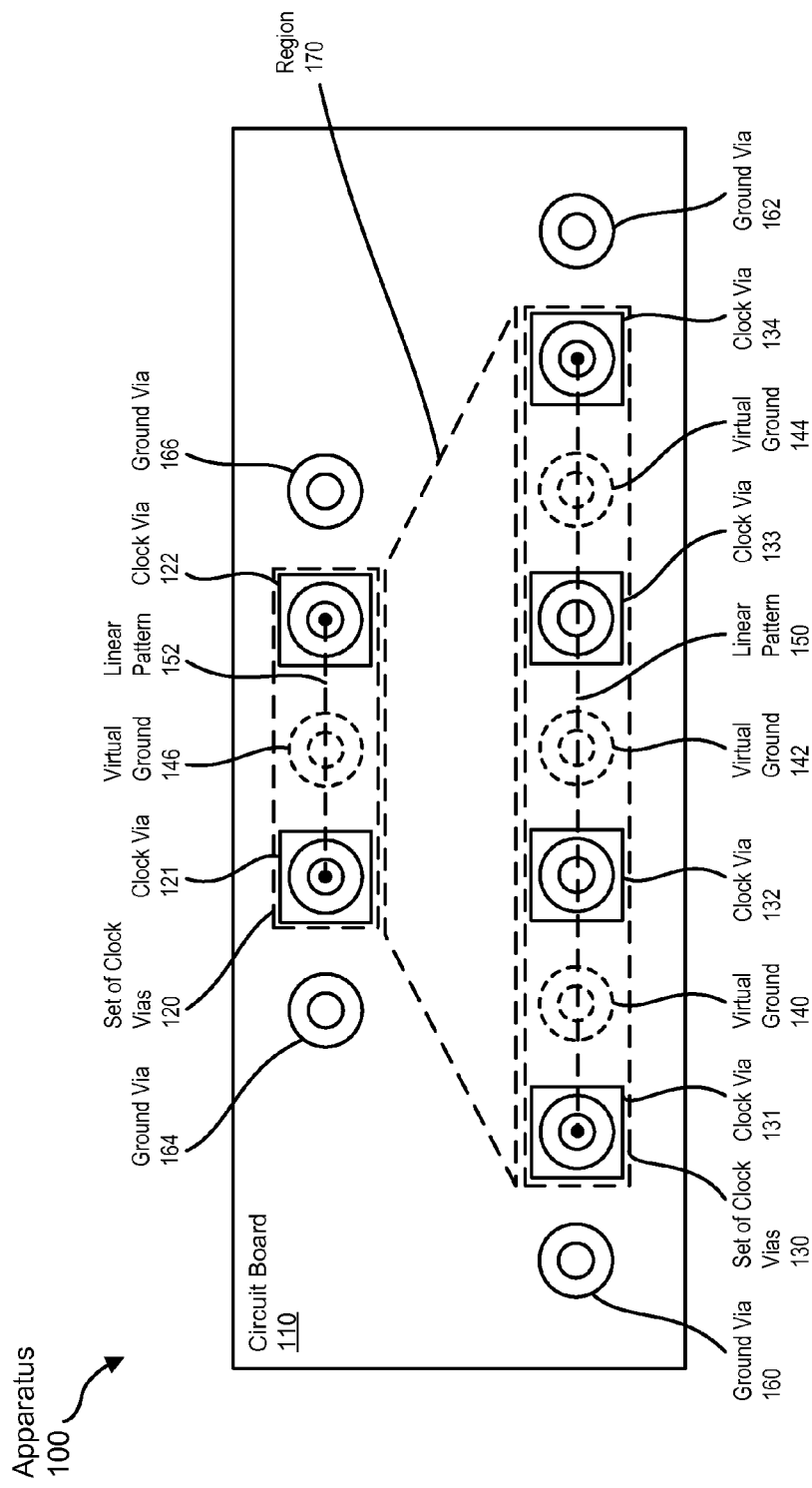
FIG. 3 is a block diagram of an exemplary apparatus for reducing interference between clock signals.

While FIGS. 1 and 2 show ground vias only being positioned around set of clock vias 130, one or more ground vias may additionally or alternatively be positioned around set of clock vias 120. For example, FIG. 3 shows ground vias 164 and 166 coupled to circuit board 110 adjacent to set of clock vias 120. FIG. 3 also shows that set of clock vias 120 may include an additional clock via 122. In this embodiment, clock vias 121 and 122 may transmit a differential clock signal. For example, clock via 121 may carry a positive copy of a clock signal and clock via 122 may carry a negative copy of the clock signal. The reverse polarities of clock vias 121 and 122 may create a virtual ground 146 between clock vias 121 and 122. Virtual ground 146, ground via 164, and ground via 166 may reduce interference emitted from clock via 121 and/or clock via 122. Virtual ground 146 and ground vias 164 and 166 may also shield clock vias 121 and/or 122 from interference from other components of circuit board 110 (e.g., by providing relatively short ground return paths for interference from one or more of clock vias 131-134).

Set of clock vias 120 may form a linear pattern 152, and ground vias 164 and 166 may be positioned in line with linear pattern 152. In some embodiments, region 170 may be bounded by and between linear patterns 152 and 150. Furthermore, linear pattern 152 may be parallel (or substantially parallel) to linear pattern 150. In such embodiments, region 170 may be shaped like a quadrilateral, parallelogram, trapezoid, square, and/or rectangle. In other embodiments, sets of clock vias 120 and 130 may be situated relative to each other such that linear pattern 152 is perpendicular to linear pattern 150. Sets of clock vias 120 and 130 may also be arranged with respect to each other in any other suitable manner with region 170 being any other suitable shape.

Figure 4:
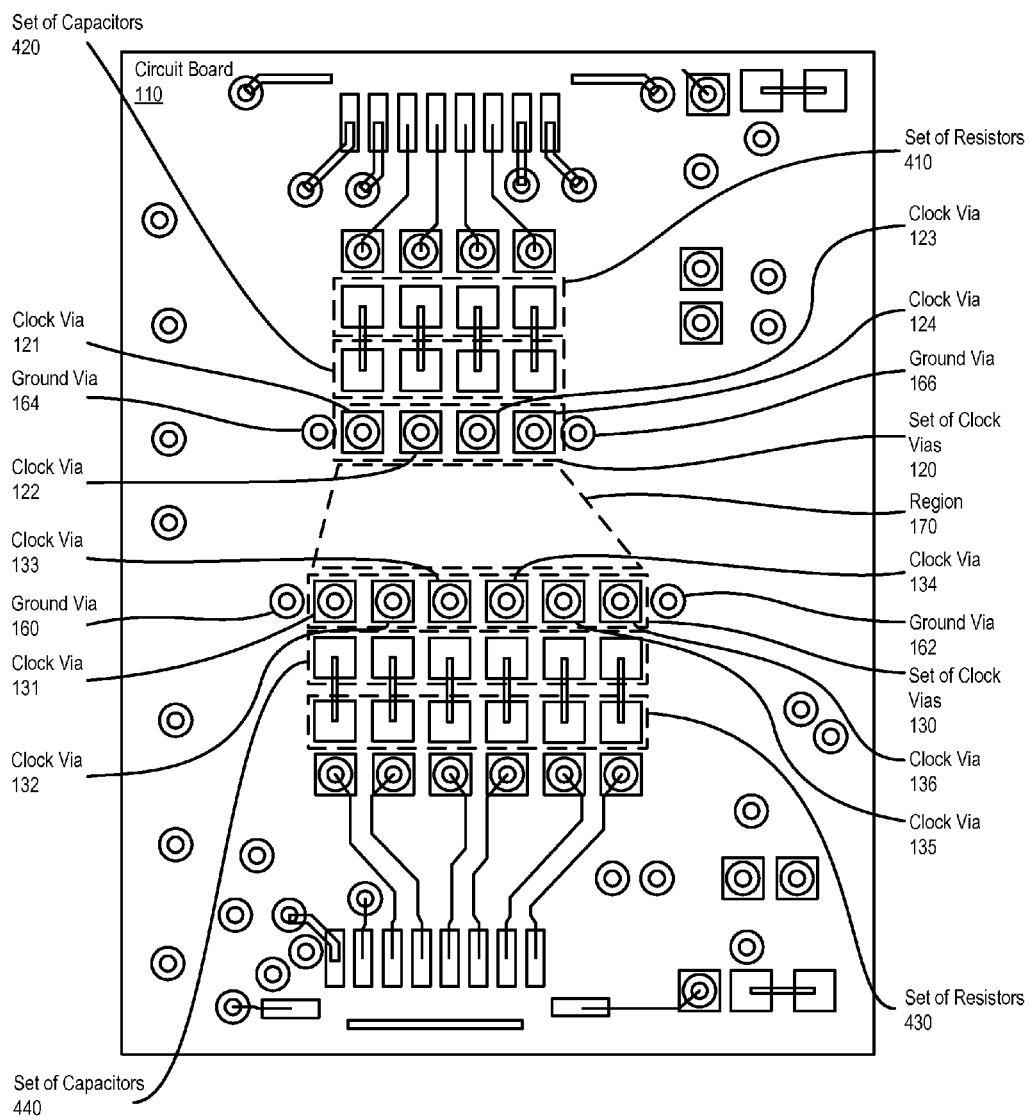
FIG. 4 is a block diagram of a front side of an exemplary circuit board for reducing interference between clock signals.

As noted above, a circuit board may be configured with any suitable number of clock vias, ground vias, and/or other electronic components. FIG. 4 shows a front side of circuit board 110 with three differential clocks being provided by set of clock vias 130 (clock vias 131-136) and two differential clocks being provided by set of clock vias 120 (clock vias 121-124). FIG. 4 also shows numerous additional ground vias on circuit board 110, but none of the ground vias on circuit board 110 are located in region 170 between sets of clock vias 120 and 130.

Figure 5:
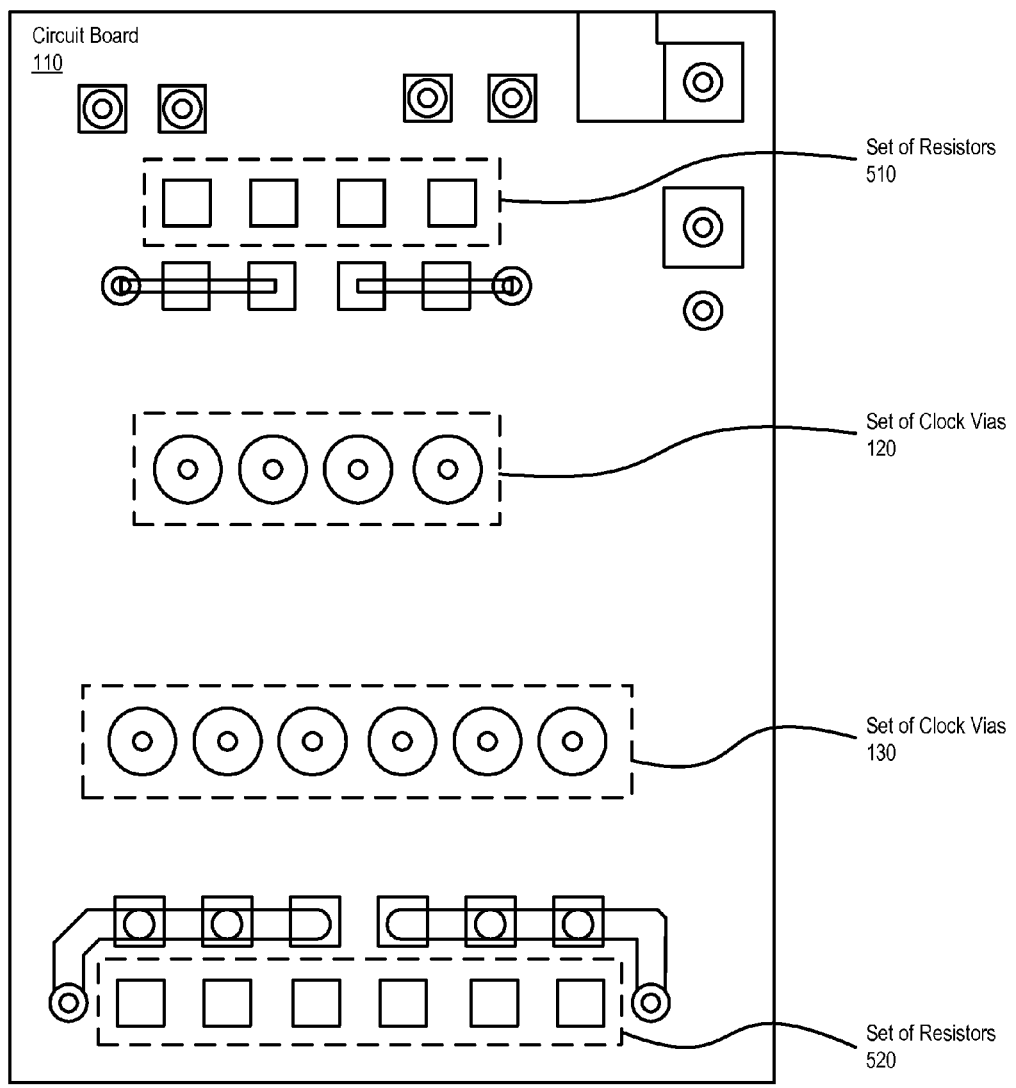
FIG. 5 is a block diagram of a back side of the exemplary circuit board shown in FIG. 4.
Figure 9:
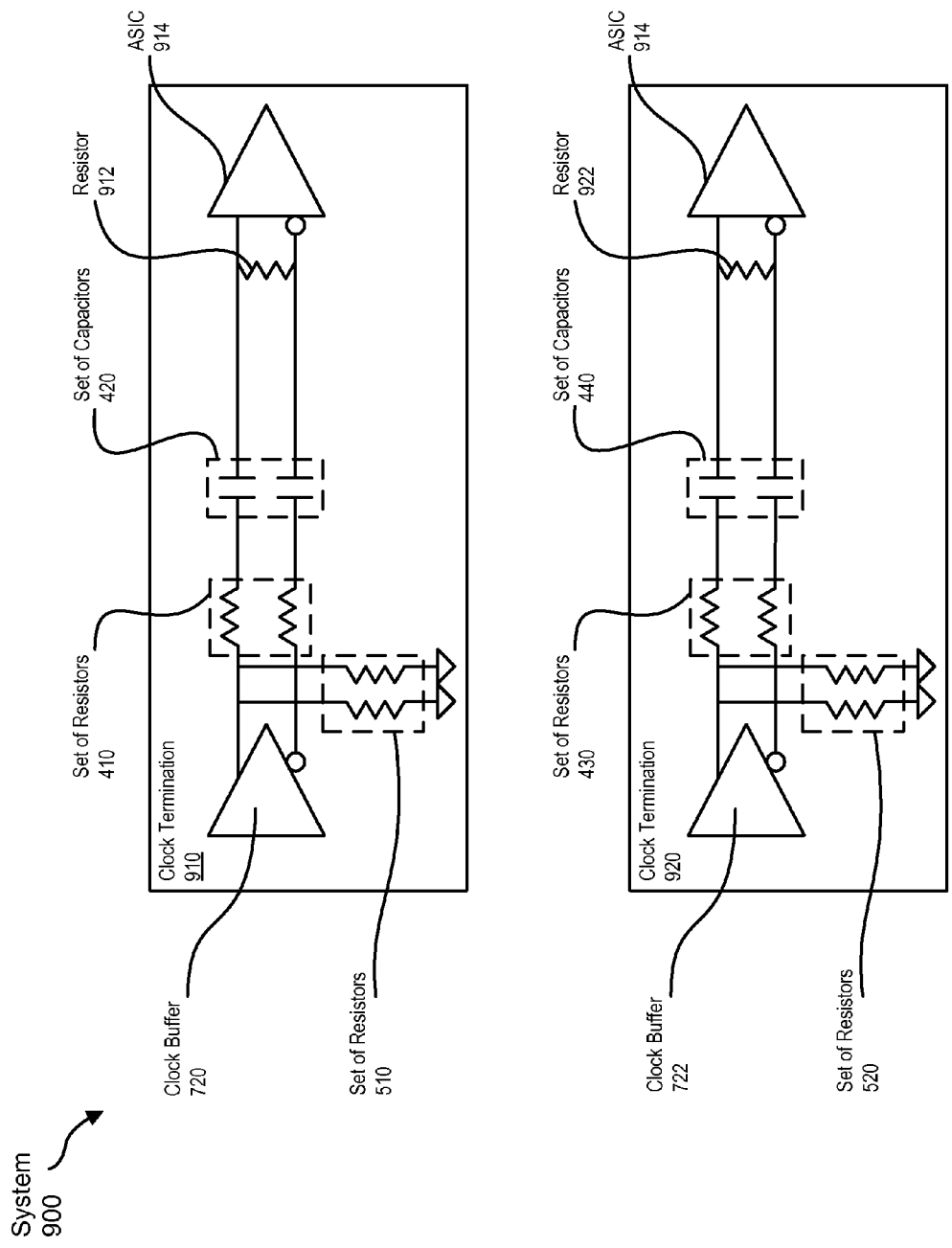
FIG. 9 is a circuit diagram of an exemplary system for reducing interference between clock signals.

Circuit board 110 may also include clock termination circuits connected to sets of clock vias 120 and 130. For example, clock termination circuits for set of clock vias 120 may include a set of resistors 410 and a set of capacitors 420. Similarly, a clock termination circuit for set of clock vias 130 may include a set of resistors 430 and a set of capacitors 440. FIG. 5 shows a reverse side of circuit board 110 with a set of resistors 510 that are coupled to set of clock vias 120 and a set of resistors 520 that are coupled to set of clock vias 130. FIG. 9 and the corresponding discussion below show an exemplary configuration of how sets of resistors 410, 430, 510, and 520 and sets of capacitors 420 and 440 may be positioned between clock buffers and an Application Specific Integrated Circuit (ASIC).

While FIGS. 1-5 show several different exemplary circuit board component configurations, embodiments of the instant disclosure are not limited to circuit boards having the components and configurations illustrated in FIGS. 1-5. For example, circuit board 110 may include more than two sets of clock vias, each of which may include any suitable number of clock vias. Circuit board 110 may also include components in addition to (or other than) the resistors, capacitors, vias, and connections shown in FIGS. 1-5. Furthermore, circuit board 110 may include various other configurations of ground via placement relative to clock via placement. For example, a single ground via may be placed adjacent to set of clock vias 120 with no clock vias adjacent to set of clock vias 130, a ground via may be placed on either side of set of clock vias 120 with no clock vias adjacent to set of clock vias 130, ground vias may be placed adjacent to one or both sides of three sets of clock vias, etc.

Figure 6:
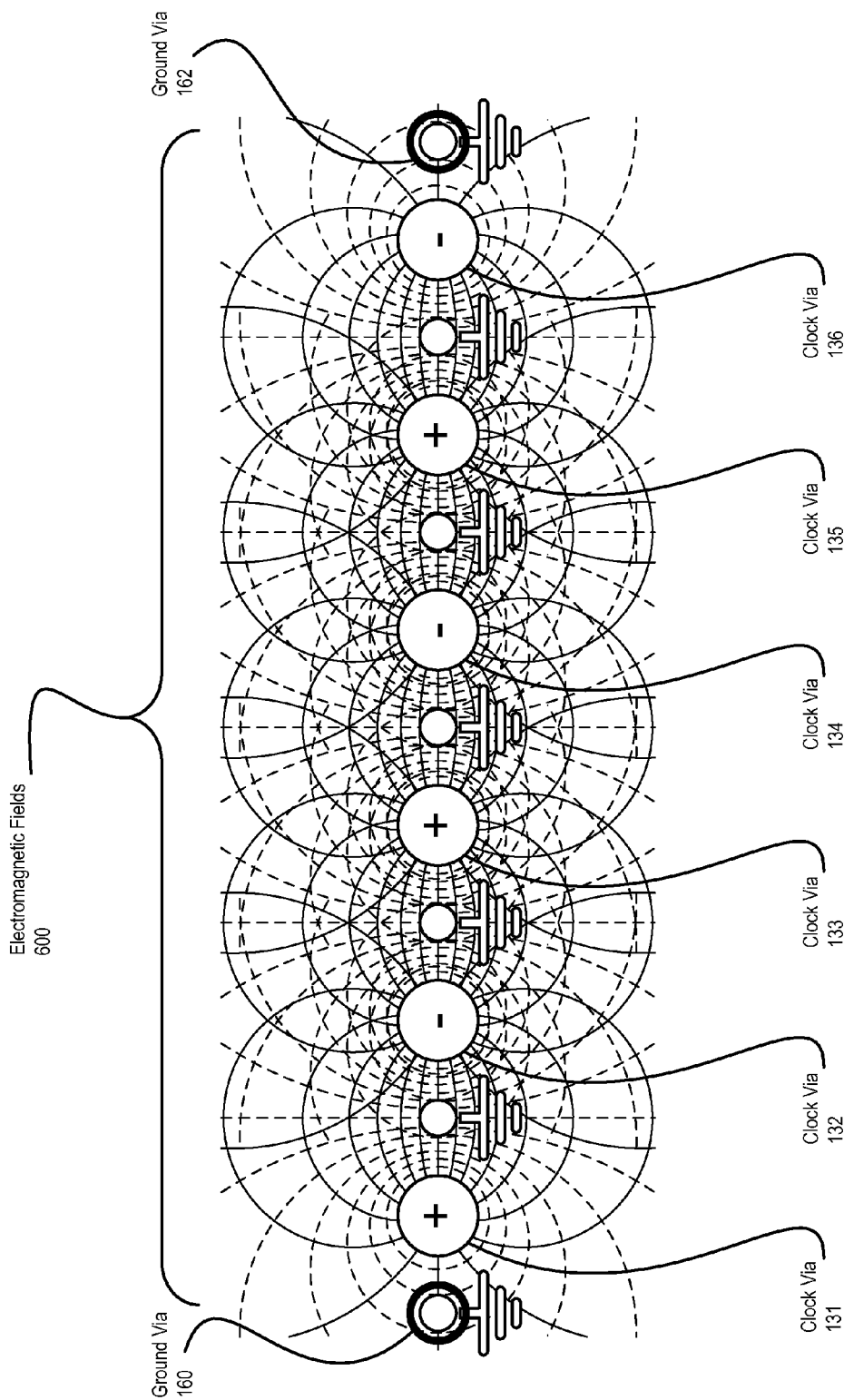
FIG. 6 is a diagram showing exemplary electromagnetic fields generated by clock vias.

FIG. 6 shows an example of how placing physical ground vias at either end of a set of clock vias may effectively reduce electromagnetic interference generated by the clock vias. As noted, clock vias 131-136 may carry copies of a differential clock signal with alternating signal polarities on each clock via. The differential clock signals may generate electromagnetic fields 600 that cancel each other out between each of clock vias 131-136, creating virtual grounds between each of clock vias 131-136. Ground via 160 may be placed adjacent to clock via 131 to ground (e.g., provide a ground path for) at least a portion of the electromagnetic field generated by clock via 131 that is not already cancelled out by a virtual ground. Similarly, ground via 162 may be placed adjacent to clock via 136 to ground at least a portion of the electromagnetic field generated by clock via 136 that is not already cancelled out by a virtual ground.

Figure 7:
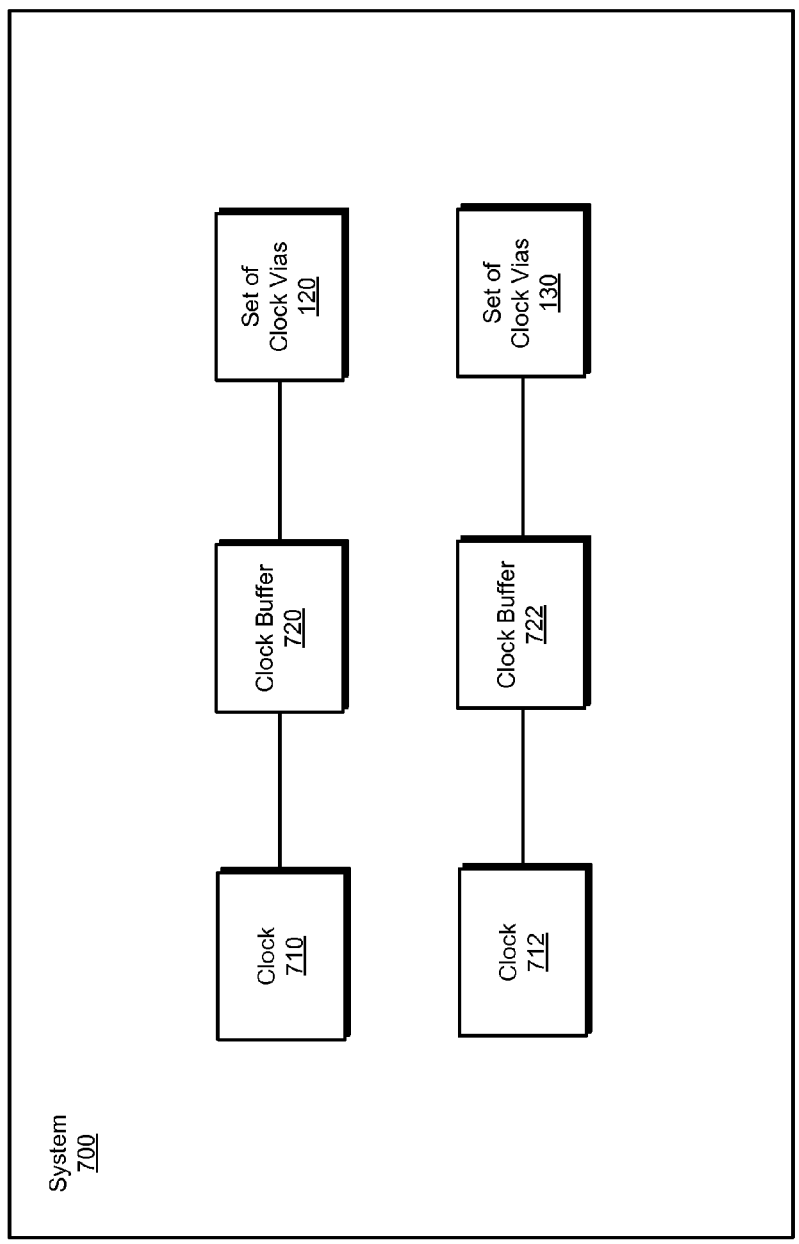
FIG. 7 is a block diagram of an exemplary system for reducing interference between clock signals.

Clock and ground via placements that result in the electromagnetic field interactions shown in FIG. 6 may be implemented in a variety of systems. For example, FIG. 7 shows a block diagram of a system 700 that includes clocks and clock buffers coupled to sets of clock vias 120 and 130. The components of system 700 may implement any suitable clocking scheme. For example, system 700 may include a synchronous system, an asynchronous system, and/or a plesiochronous system.

System 700 may include a first clock 710 that generates a first clock signal and a second clock 712 that generates a second clock signal that cycles at a frequency that is different from a frequency of the first clock signal. The term "clock" generally refers to any type of form of electronic component configured to and/or capable of generating a clock signal, multiplying a clock signal, and/or otherwise providing a clock signal to other components on a system.

In some embodiments, clocks 710 and 712 may be connected directly to circuit board 110. Alternatively, clocks 710 and 712 may be located in system 700 on any other suitable circuit board. Clocks 710 and 712 may generate signals with frequencies that are similar or substantially similar (e.g., less than 10% apart). Alternatively, clocks 710 and 712 may generate clock signals with dissimilar frequencies.

System 700 may also include a clock buffer 720 coupled to clock 710 and a clock buffer 722 coupled to clock 712. Clock buffer 720 may communicatively couple clock 710 to set of clock vias 120. In other words, clock buffer 720 may transmit copies of a clock signal generated by clock 710 to each clock via in set of clock vias 120. Clock buffer 722 may communicatively couple clock 712 to set of clock vias 130. Thus, clock buffer 722 may transmit copies of a clock signal generated by clock 712 to each clock via in set of clock vias 130. The phrase "clock buffer" may generally refer to any type or form of electronic component configured to and/or capable of increasing the drive strength of a clock signal, delaying a clock signal, repeating a clock signal, etc.

When sets of clock vias are all coupled to the same clock buffer (i.e., in a clock tree), each clock signal carried by a via in the set may have an identical or substantially similar frequency and amplitude as clock signals carried by other vias in the set. Furthermore, there may be minimal or no skew between each clock via in a clock tree. As a result, electromagnetic fields generated by reverse polarity clock vias that are connected to the same clock buffer may at least partially cancel out each other.

Figure 8:
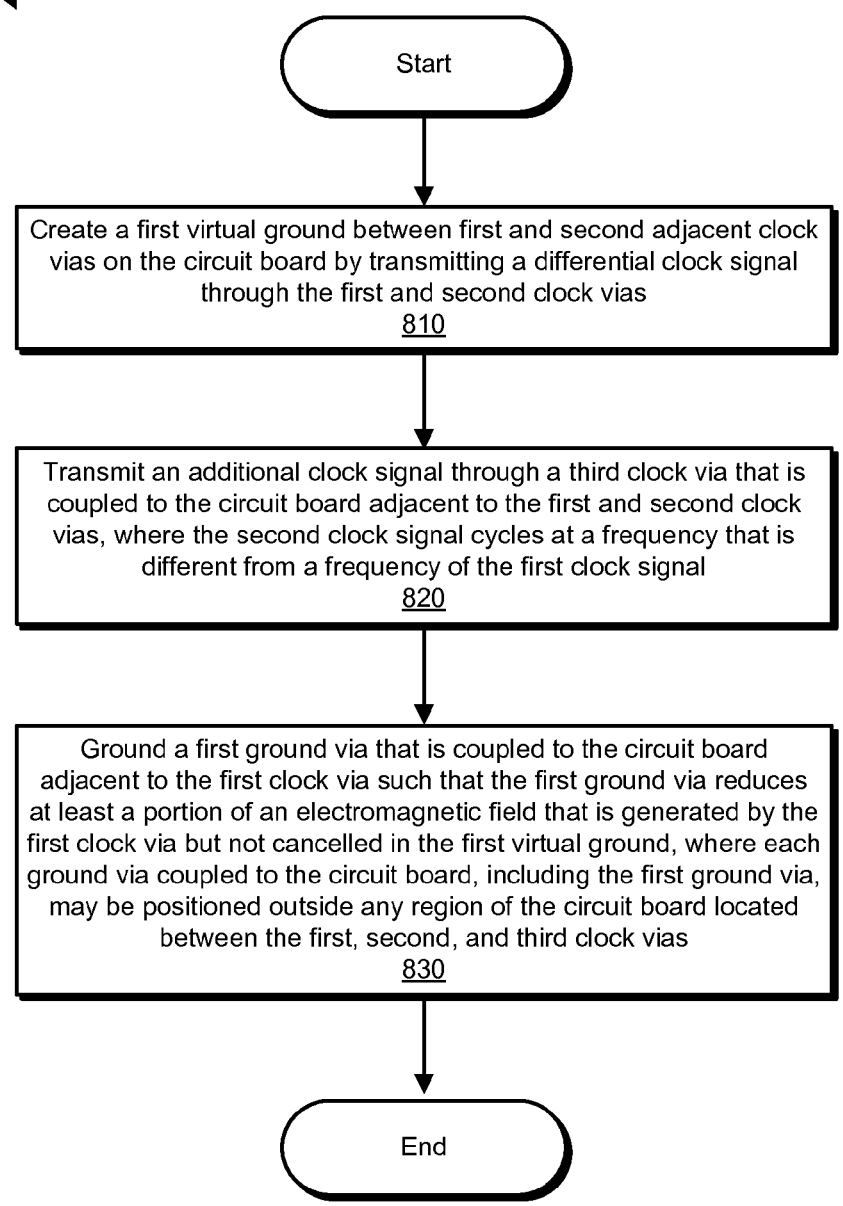
FIG. 8 is a flow diagram of an exemplary method for reducing interference between clock signals.

FIG. 8 is a flow diagram of an exemplary method 800 for reducing interference between clock signals. Method 800 may include the step of creating a first virtual ground between first and second adjacent clock vias on a circuit board by transmitting a differential clock signal through the first and second clock vias (810). A virtual ground may be created in any suitable manner. For example, a virtual ground may be created between two clock vias (e.g., clock vias 131 and 132) when the clock vias are carrying differential clock signals with the same frequency and amplitude but are phase-shifted by 180 degrees. Thus, a virtual ground may be created by connecting adjacent clock vias to a differential clock (e.g., by inserting a line card into a system, by causing an electrical signal to be transmitted between the clock vias and the differential clock, etc.) and causing the differential clock to transmit clock signals through the clock vias (e.g., by powering on the system, by waking the system from sleep or hibernation, by sending a control signal to the clock to cause the clock to begin to function, etc.).

A first via may be adjacent to a second via when the first and second vias are in close physical proximity to each other. For example, a distance between adjacent vias may be less than two times the width of a via, less than the width of a single via, less than 300 mils, less than 200 mils, less than 100 mils, less than 50 mils, etc.

Returning to FIG. 9, method 800 may also include the step of transmitting an additional clock signal through a third clock via that is coupled to the circuit board adjacent to the first and second clock vias, where the second clock signal cycles at a frequency that is different from a frequency of the first clock signal (820). An additional clock signal may be transmitted through a third clock via (e.g., clock via 121) in any suitable manner. For example, connecting circuit board 110 to a computer system (e.g., system 700) may cause clock 710 to transmit a clock signal to clock via 121. Additionally or alternatively, powering on and/or waking system 700 may cause clock 710 to transmit a clock signal to clock via 121. In some embodiments, clock 710 may receive a control signal that causes clock 710 to begin sending a clock signal to clock via 121.

Method 800 may further include grounding a first ground via that is coupled to the circuit board adjacent to the first clock via such that the first ground via reduces at least a portion of an electromagnetic field that is generated by the first clock via but not cancelled in the first virtual ground, where each ground via coupled to the circuit board, including the first ground via, may be positioned outside any region of the circuit board located between the first, second, and third clock vias (830). A ground via may be grounded in any suitable manner. For example, a ground via (e.g., ground via 160) may be grounded by causing the ground via to be connected to a ground of a system that includes the ground via (e.g., by inserting a line card that includes the ground via into the system, by connecting the system to a power and ground source, by waking or powering on the system, etc.).

In some embodiments, method 800 may also include grounding a second ground via (e.g., ground via 162) that is coupled to the circuit board adjacent to the second clock via such that the second ground via reduces at least a portion of an electromagnetic field that is generated by the second clock via (e.g., clock via 132 in FIG. 1 and/or clock via 134 in FIGS. 2 and 3) but not cancelled in the virtual ground (e.g., virtual ground 140 in FIG. 1 or virtual ground 142 in FIG. 2). Method 800 may also include grounding one or more additional or alternative ground vias and/or creating one or more additional and/or alternative virtual grounds.

Method 800 may be performed on any type or form of system with any clock termination circuit. FIG. 9 shows circuit diagrams of an exemplary system 900 on which method 800 may be performed. As shown in FIG. 9, clock termination circuits 910 and 920 may couple clock buffers 720 and 722 to an ASIC 914. ASIC 914 may include circuit board 110 and/or any other suitable integrated circuit.

Clock termination 910 may include set of resistors 410, set of resistors 510, set of capacitors 420, and resistor 912, each of which may connect clock buffer 720 to an ASIC 914 (e.g., to set of clock vias 120 on circuit board 110). Similarly, clock termination 920 may include set of resistors 430, set of resistors 520, set of capacitors 440, and resistor 922, each of which may connect clock buffer 722 to ASIC 914 (e.g., to set of clock vias 130 on circuit board 110).

Figure 10:
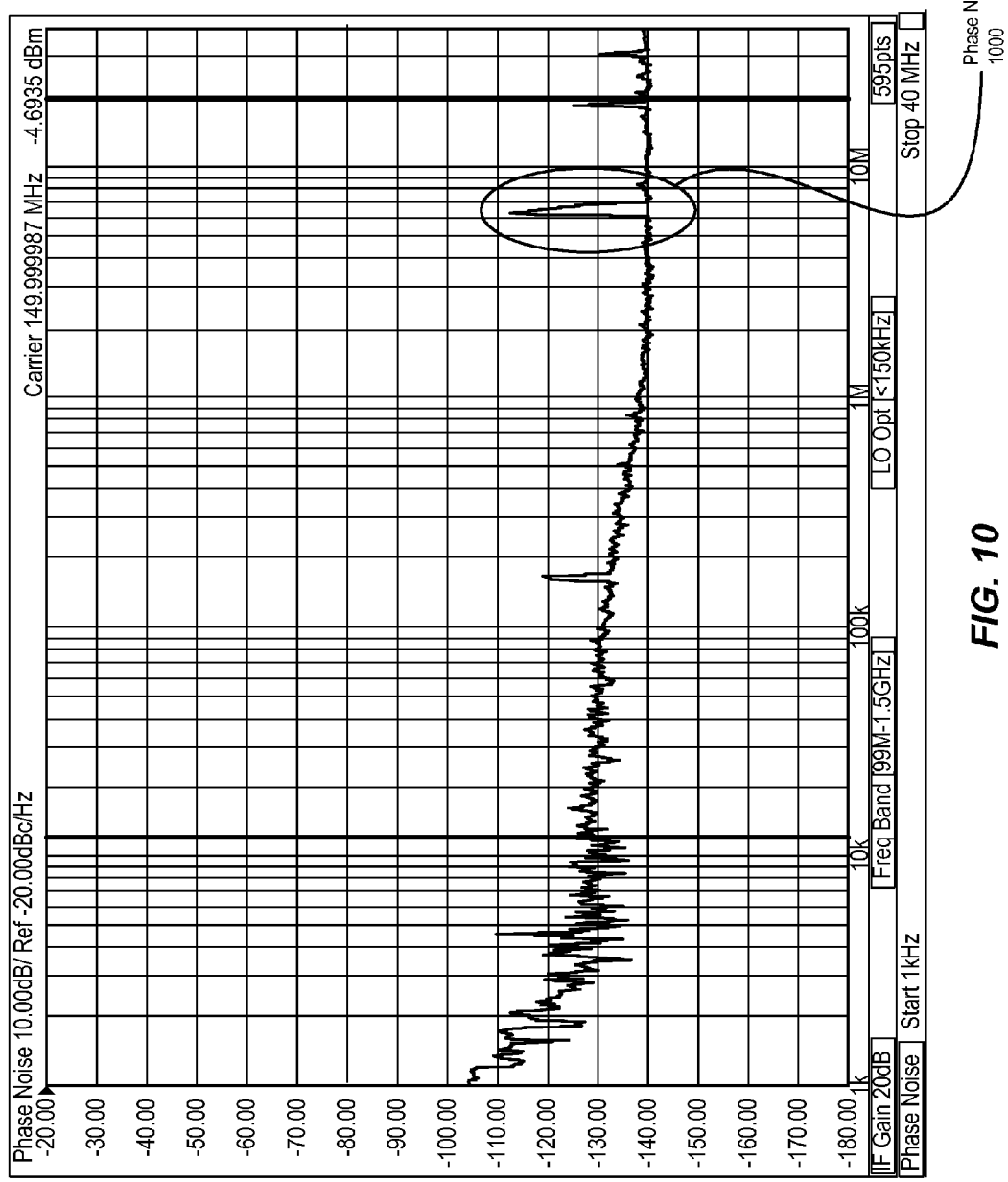
FIG. 10 is a graph of exemplary test results that show a phase noise spur in a clock signal.

When clock signals are sent through clock termination circuits 910 and 920, virtual grounds may be created between clock vias on ASIC 914. Furthermore, when ASIC 914 is grounded (e.g., connected to a power supply and corresponding ground), ground vias on ASIC 914 may be grounded. If ground vias on ASIC 914 are not positioned to reduce interference between clock signals, cross-talk coupling between clock vias on ASIC 914 may occur. FIG. 10 shows a phase noise test result for a circuit with the general configuration shown in FIG. 9 on a circuit board with the general configuration shown in FIGS. 4 and 5 but without ground vias positioned adjacent to sets of clock vias 120 and 130. For the test, a differential clock signal with a frequency of 150 megahertz (MHz) was transmitted through set of clock vias 120, and a differential clock signal with a frequency of 156.25 MHz was transmitted through set of clock vias 130.

The phase noise graph shown in FIG. 10 was generated by measuring phase noise of the clock signal carried by set of clock vias 120. As shown, the clock signal carried by set of clock vias 120 has a phase noise spur 1000 at 6.25 MHz, which is the frequency difference between the clock signal on set of clock vias 120 and the clock signal on set of clock vias 130. In the test illustrated by FIG. 10, phase noise spur 1000 was measured at approximately −115 decibels relative to the clock signal per hertz (dBc/Hz), which may violate a phase noise specification for circuit board 110 and may also cause components that rely on the clock signal transmitted through set of clock vias 120 to function improperly.

Figure 11:
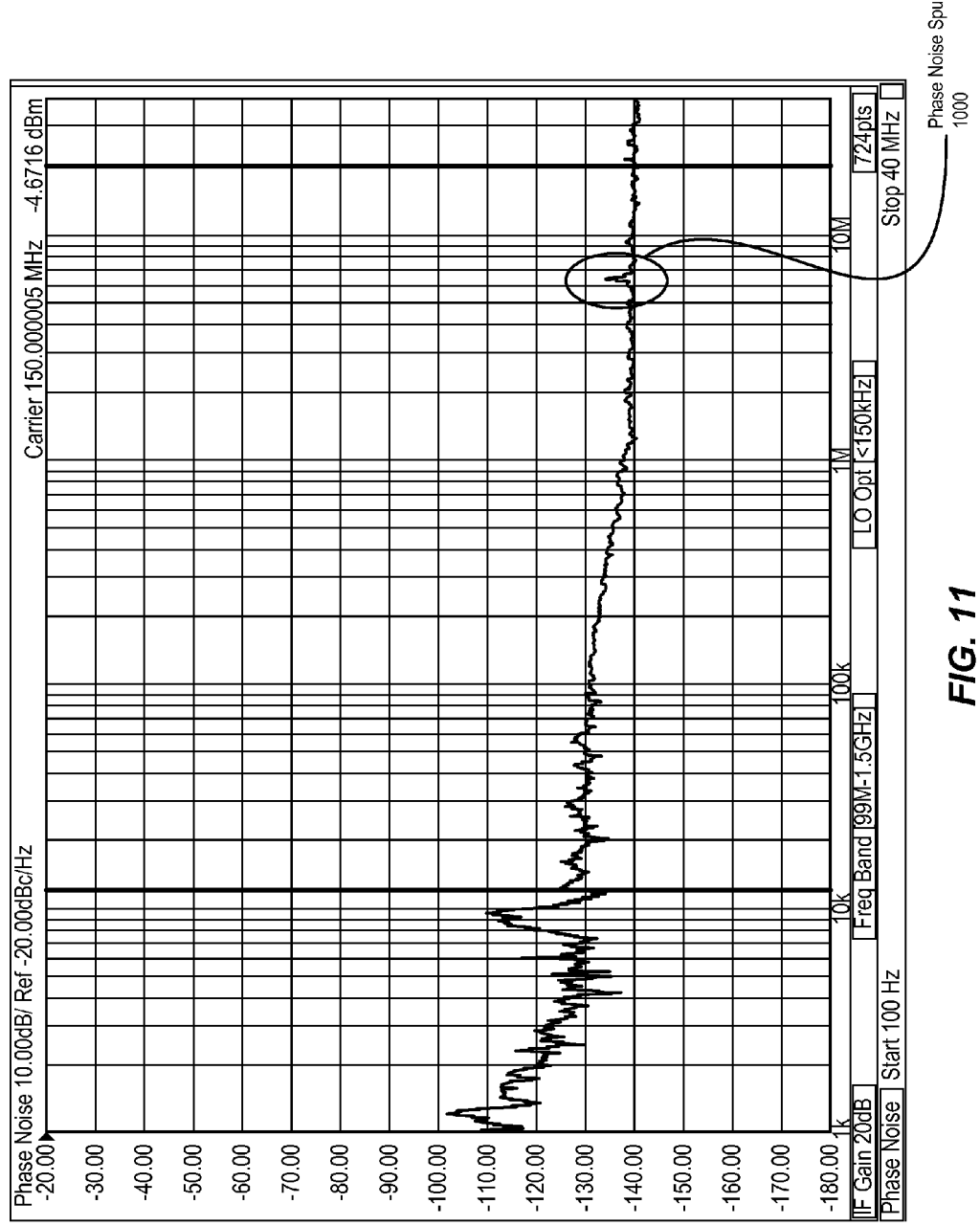
FIG. 11 is a graph of exemplary test results that show a reduced phase noise spur in a clock signal.

FIG. 11 shows a phase noise test result for a circuit with the general configuration shown in FIG. 9 on a circuit board with a configuration that simulates the configuration shown in FIGS. 4 and 5 with ground vias positioned as discussed herein. As shown in FIG. 11, phase noise spur 1000 has been significantly reduced and/or eliminated as a result of placing ground vias in accordance with embodiments of the instant disclosure. In the test illustrated by FIG. 11, phase noise spur 1000 was measured at approximately −135 dBc/Hz, which is an improvement of approximately 20 dBc/Hz over the test illustrated in FIG. 10. The reduction in phase noise shown in FIG. 11 may place circuit board 110 within the requirements of a phase noise specification and may cause the clock signal transmitted through set of clock vias 120 to be more reliable.

As noted, embodiments of the instant disclosure may reduce phase noise in clock signals by using only a limited number of physical ground vias (e.g., one ground via on either side of a clock tree). The embodiments described herein may be particularly useful in achieving better noise performance on high-density circuit boards and may result in reduced manufacturing costs for high-density circuit boards. Embodiments of the instant disclosure may also be particularly useful for increasing the speed and performance of various networking devices, as discussed in greater detail below.

Figure 12:
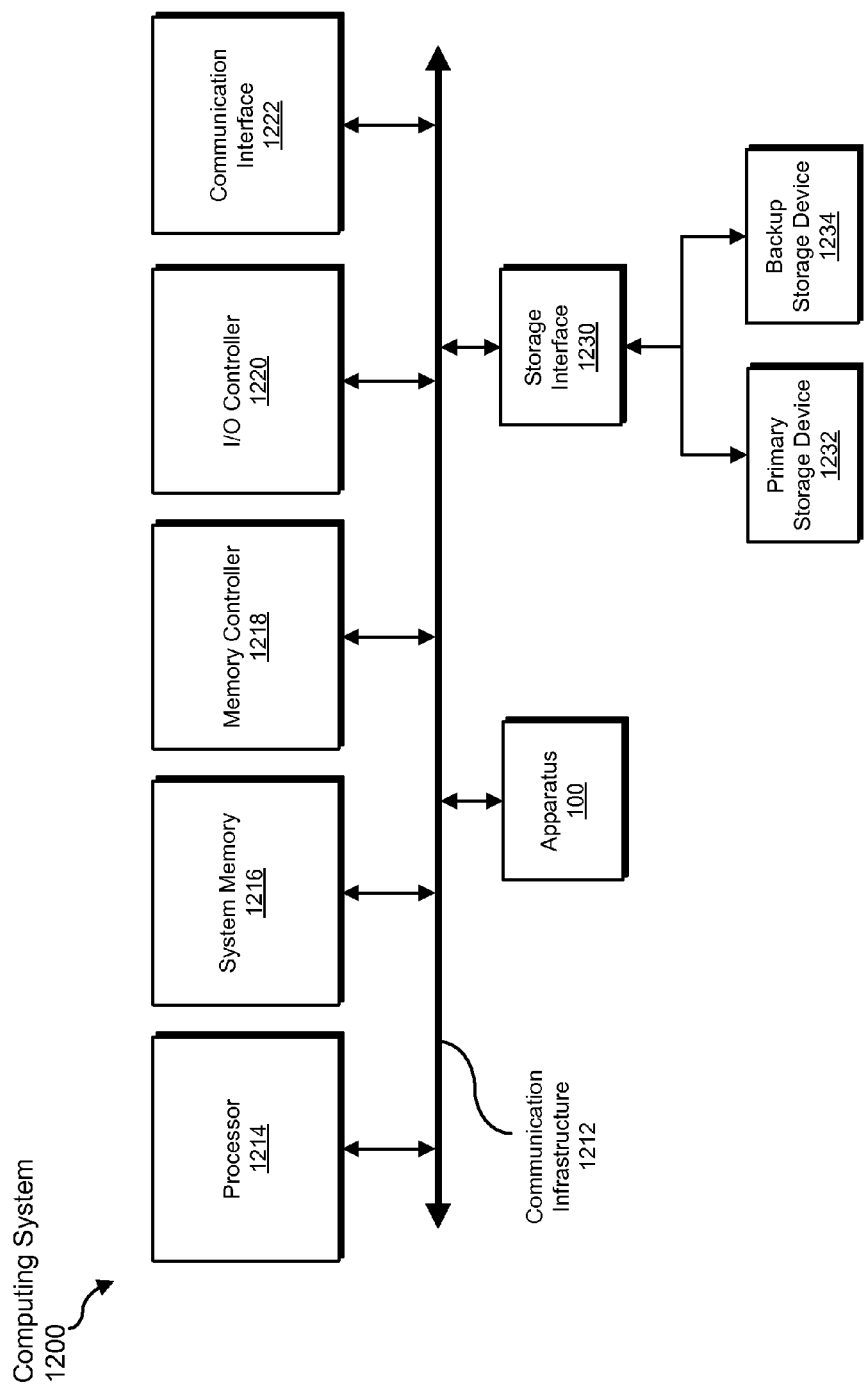
FIG. 12 is a block diagram of an exemplary computing system capable of implementing one or more of the embodiments described and/or illustrated herein.

FIG. 12 is a block diagram of an exemplary computing system 1200 capable of reducing and/or eliminating phase noise caused by cross-talk coupling between clock vias. For example, computing system 1200 may include apparatus 100. Apparatus 100 may be included in computing system 1200 as an integrated component, as a removable card, as part of one or more of the components shown in computing system 1200, and/or in any other suitable manner. Computing system 1200 may also include one or more of the clocks, clock buffers, and/or other components presented herein.

In some embodiments, all or a portion of computing system 1200 may perform and/or be a means for performing, either alone or in combination with other elements, one or more of the creating, transmitting, and/or grounding steps described in FIG. 8. All or a portion of computing system 1200 may also perform and/or be a means for performing and/or implementing any other steps, methods, or processes described and/or illustrated herein.

Computing system 1200 broadly represents any single or multi-processor computing device or system capable of executing computer-readable instructions. Examples of computing system 1200 include, without limitation, workstations, laptops, client-side terminals, servers, distributed computing systems, mobile devices, network switches, network routers (e.g., backbone routers, edge routers, core routers, mobile service routers, broadband routers, etc.), network appliances (e.g., network security appliances, network control appliances, network timing appliances, SSL VPN (Secure Sockets Layer Virtual Private Network) appliances, etc.), network controllers, gateways (e.g., service gateways, mobile packet gateways, multi-access gateways, security gateways, etc.), and/or any other type or form of computing system or device.

Computing system 1200 may be programmed, configured, and/or otherwise designed to comply with one or more networking protocols. According to certain embodiments, computing system 1200 may be designed to work with protocols of one or more layers of the Open Systems Interconnection (OSI) reference model, such as a physical layer protocol, a link layer protocol, a network layer protocol, a transport layer protocol, a session layer protocol, a presentation layer protocol, and/or an application layer protocol. For example, computing system 1200 may include a network device configured according to a Universal Serial Bus (USB) protocol, an Institute of Electrical and Electronics Engineers (IEEE) 1394 protocol, an Ethernet protocol, a T1 protocol, a Synchronous Optical Networking (SONET) protocol, a Synchronous Digital Hierarchy (SDH) protocol, an Integrated Services Digital Network (ISDN) protocol, an Asynchronous Transfer Mode (ATM) protocol, a Point-to-Point Protocol (PPP), a Point-to-Point Protocol over Ethernet (PPPoE), a Point-to-Point Protocol over ATM (PPPoA), a Bluetooth protocol, and IEEE 801 protocol, a frame relay protocol, a token ring protocol, a spanning tree protocol, and/or any other suitable protocol.

Computing system 1200 may include various network components and/or other computing components. For example, computing system 1200 may include least one processor 1214 and a system memory 1216. Processor 1214 generally represents any type or form of processing unit capable of processing data or interpreting and executing instructions. Processor 1214 may comprise an ASIC, a system on a chip (e.g., a network processor), a hardware accelerator, a general purpose processor, and/or any other suitable processing element.

Processor 1214 may process data according to one or more of the networking protocols discussed above. For example, processor 1214 may execute or implement a portion of a protocol stack, may process packets, may perform memory operations (e.g., queuing packets for later processing), may execute end-user applications, and/or may perform any other processing tasks.

System memory 1216 generally represents any type or form of volatile or non-volatile storage device or medium capable of storing data and/or other computer-readable instructions. Examples of system memory 1216 include, without limitation, Random Access Memory (RAM), Read Only Memory (ROM), flash memory, or any other suitable memory device. Although not required, in certain embodiments computing system 1200 may include both a volatile memory unit (such as, for example, system memory 1216) and a non-volatile storage device (such as, for example, primary storage device 1232, as described in detail below). System memory 1216 may be implemented as shared memory and/or distributed memory in a network device. Furthermore, system memory 1216 may store packets and/or other information used in networking operations.

In certain embodiments, exemplary computing system 1200 may also include one or more components or elements in addition to processor 1214 and system memory 1216. For example, as illustrated in FIG. 12, computing system 1200 may include a memory controller 1218, an Input/Output (I/O) controller 1220, and a communication interface 1222, each of which may be interconnected via a communication infrastructure 1212. Communication infrastructure 1212 generally represents any type or form of infrastructure capable of facilitating communication between one or more components of a computing device. Examples of communication infrastructure 1212 include, without limitation, a communication bus (such as a Serial ATA (SATA), an Industry Standard Architecture (ISA), Peripheral Component Interconnect (PCI), PCI Express (PCIe), and/or any other suitable bus) and a network.

Memory controller 1218 generally represents any type or form of device capable of handling memory or data or controlling communication between one or more components of computing system 1200. For example, in certain embodiments memory controller 1218 may control communication between processor 1214, system memory 1216, and I/O controller 1220 via communication infrastructure 1212. In some embodiments, memory controller 1218 may include a Direct Memory Access (DMA) unit that may transfer data (e.g., packets) to or from a link adapter.

I/O controller 1220 generally represents any type or form of module capable of coordinating and/or controlling the input and output functions of a computing device. For example, in certain embodiments I/O controller 1220 may control or facilitate transfer of data between one or more elements of computing system 1200, such as processor 1214, system memory 1216, communication interface 1222, and storage interface 1230.

Communication interface 1222 broadly represents any type or form of communication device or adapter capable of facilitating communication between exemplary computing system 1200 and one or more additional devices. For example, in certain embodiments communication interface 1222 may facilitate communication between computing system 1200 and a private or public network including additional computing systems. Examples of communication interface 1222 include, without limitation, a link adapter, a wired network interface (such as a network interface card), a wireless network interface (such as a wireless network interface card), and any other suitable interface. In at least one embodiment, communication interface 1222 may provide a direct connection to a remote server via a direct link to a network, such as the Internet. Communication interface 1222 may also indirectly provide such a connection through, for example, a local area network (such as an Ethernet network), a personal area network, a wide area network, a private network (e.g., a virtual private network), a telephone or cable network, a cellular telephone connection, a satellite data connection, or any other suitable connection.

In certain embodiments, communication interface 1222 may also represent a host adapter configured to facilitate communication between computing system 1200 and one or more additional network or storage devices via an external bus or communications channel. Examples of host adapters include, without limitation, Small Computer System Interface (SCSI) host adapters, Universal Serial Bus (USB) host adapters, IEEE 1394 host adapters, Advanced Technology Attachment (ATA), Parallel ATA (PATA), Serial ATA (SATA), and External SATA (eSATA) host adapters, Fibre Channel interface adapters, Ethernet adapters, or the like. Communication interface 1222 may also enable computing system 1200 to engage in distributed or remote computing. For example, communication interface 1222 may receive instructions from a remote device or send instructions to a remote device for execution.

As illustrated in FIG. 12, exemplary computing system 1200 may also include a primary storage device 1232 and/or a backup storage device 1234 coupled to communication infrastructure 1212 via a storage interface 1230. Storage devices 1232 and 1234 generally represent any type or form of storage device or medium capable of storing data and/or other computer-readable instructions. For example, storage devices 1232 and 1234 may be a magnetic disk drive (e.g., a so-called hard drive), a solid state drive, a floppy disk drive, a magnetic tape drive, an optical disk drive, a flash drive, or the like. Storage interface 1230 generally represents any type or form of interface or device for transferring data between storage devices 1232 and 1234 and other components of computing system 1200.

In certain embodiments, storage devices 1232 and 1234 may be configured to read from and/or write to a removable storage unit configured to store computer software, data, or other computer-readable information. Examples of suitable removable storage units include, without limitation, a floppy disk, a magnetic tape, an optical disk, a flash memory device, or the like. Storage devices 1232 and 1234 may also include other similar structures or devices for allowing computer software, data, or other computer-readable instructions to be loaded into computing system 1200. For example, storage devices 1232 and 1234 may be configured to read and write software, data, or other computer-readable information. Storage devices 1232 and 1234 may be a part of computing system 1200 or may be separate devices accessed through other interface systems.

Many other devices or subsystems may be connected to computing system 1200. Conversely, all of the components and devices illustrated in FIG. 12 need not be present to practice the embodiments described and/or illustrated herein. The devices and subsystems referenced above may also be interconnected in different ways from those shown in FIG. 12. Computing system 1200 may also employ any number of software, firmware, and/or hardware configurations. For example, one or more of the exemplary embodiments disclosed herein may be encoded as a computer program (also referred to as computer software, software applications, computer-readable instructions, or computer control logic) on a computer-readable-storage medium. The phrase "computer-readable-storage medium" generally refers to any form of device, carrier, or medium capable of storing or carrying computer-readable instructions. Examples of computer-readable-storage media include, without limitation, transmission-type media, such as carrier waves, and non-transitory-type media, such as magnetic-storage media (e.g., hard disk drives and floppy disks), optical-storage media (e.g., Compact Disks (CDs) or Digital Video Disks (DVDs)), electronic-storage media (e.g., solid-state drives and flash media), and other distribution systems.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

In some examples, all or a portion of exemplary apparatus 100 in FIG. 1 may represent portions of a cloud-computing or network-based environment. Cloud-computing environments may provide various services and applications via the Internet. These cloud-based services (e.g., software as a service, platform as a service, infrastructure as a service, etc.) may be accessible through a web browser or other remote interface. Various functions described herein may also provide network switching capabilities, gateway access capabilities, network security functions, content caching and delivery services for a network, network control services, and/or and other networking functionality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "a" or "an," as used in the specification and claims, are to be construed as meaning "at least one of." In addition, for ease of use, the words "including" and "having," as used in the specification and claims, are interchangeable with and have the same meaning as the word "comprising."

What is claimed is:

1. An apparatus for reducing interference between clock signals, the apparatus comprising:
    a circuit board;
    a first set of clock vias that transmit a first clock signal and are coupled to the circuit board;
    a second set of clock vias that transmit a second clock signal that cycles at a frequency that is different from a frequency of the first clock signal, wherein the second set of clock vias are coupled to the circuit board in a linear pattern adjacent to the first set of clock vias;
    at least one ground via coupled to the circuit board in line with the second set of clock vias, wherein a total number of ground vias coupled to the circuit board is less than a total number of clock vias coupled to the circuit board;
    wherein each ground via coupled to the circuit board, including the at least one ground via, is positioned outside any region of the circuit board located between the first and second sets of clock vias.

2. The apparatus of claim 1, wherein the at least one ground via coupled to the circuit board in line with the second set of clock vias comprises:
    a first ground via coupled to the circuit board adjacent to a beginning clock via in the linear pattern;
    a second ground via coupled to the circuit board adjacent to an end clock via in the linear pattern.

3. The apparatus of claim 1, wherein:
    the first set of clock vias comprises a plurality of clock vias that are coupled to the circuit board in a linear pattern;
    the linear pattern of the first set of clock vias is at least substantially parallel to the linear pattern of the second set of clock vias.

4. The apparatus of claim 3, wherein each ground via coupled to the circuit board is positioned outside a quadrilateral-shaped region that is between and bounded by the linear patterns of the first and second sets of clock vias.

5. The apparatus of claim 3, further comprising at least one additional ground via coupled to the circuit board in line with the first set of clock vias.

6. The apparatus of claim 5, wherein the at least one ground via coupled to the circuit board in line with the second set of clock vias comprises:
    a first ground via coupled to the circuit board adjacent to a beginning clock via in the linear pattern of the second set of clock vias;
    a second ground via coupled to the circuit board adjacent to an end clock via in the linear pattern of the second set of clock vias.

7. The apparatus of claim 6, wherein the at least one additional ground via coupled to the circuit board in line with the first set of clock vias comprises:
    a third ground via coupled to the circuit board adjacent to a beginning clock via in the linear pattern of the first set of clock vias;
    a fourth ground via coupled to the circuit board adjacent to an end clock via in the linear pattern of the first set of clock vias.

8. The apparatus of claim 1, wherein:
    the second clock signal comprises a first differential signal and a second differential signal;
    a phase of the second differential signal is offset 180 degrees from a phase of the first differential signal;
    the second set of clock vias comprises a plurality of clock vias that transmit the first differential signal and a plurality of clock vias that transmit the second differential signal.

9. The apparatus of claim 1, wherein:
    the frequency of the second clock signal is substantially similar to the frequency of the first clock signal.

10. The apparatus of claim 1, wherein:
    the circuit board comprises a high-density circuit board;
    a distance between the first and second sets of clock vias is smaller than a distance needed to place a ground via between the first and second sets of clock vias.

11. A method for reducing interference between clock signals, the method comprising:
- creating a first virtual ground between first and second adjacent clock vias on a circuit board by transmitting a differential clock signal through the first and second clock vias, the differential clock signal being generated by a first clock connected to the circuit board;
- transmitting an additional clock signal through a third clock via that is coupled to the circuit board adjacent to the first and second clock vias, the additional clock signal being generated by a second clock connected to the circuit board and configured to cycle at a frequency that is different from a frequency of the differential clock signal;
- grounding a first ground via that is coupled to the circuit board adjacent to the first clock via such that the first ground via reduces at least a portion of an electromagnetic field that is generated by the first clock via but not cancelled in the first virtual ground;
- wherein each ground via coupled to the circuit board, including the first ground via, is positioned outside any region of the circuit board located between the first, second, and third clock vias.

12. The method of claim 11, further comprising grounding a second ground via that is coupled to the circuit board adjacent to the second clock via such that the second ground via reduces at least a portion of an electromagnetic field that is generated by the first clock via but not cancelled in the first virtual ground.

13. The method of claim 12, wherein a total number of ground vias coupled to the circuit board is less than a total number of clock vias coupled to the circuit board.

14. The method of claim 11, wherein:
- the additional clock signal comprises an additional differential clock signal;
- transmitting the additional clock signal through the third clock via comprises creating a second virtual ground between the third clock via and a fourth clock via by transmitting the additional differential clock signal through the third and fourth clock vias;
- grounding a second ground via that is coupled to the circuit board adjacent to the third clock via such that the second ground via reduces at least a portion of an electromagnetic field that is generated by the first clock via but not cancelled in the second virtual ground.

15. The method of claim 11, wherein:
the circuit board comprises a high-density circuit board;
distances between the first, second, and third clock vias are smaller than a distance needed to place a ground via between any of the first, second, and third clock vias.

16. The method of claim 11, wherein the region of the circuit board located between the first, second, and third clock vias is smaller than an area needed to place a ground via.

17. A system for reducing interference between clock signals, the system comprising: a first clock that generates a first clock signal; a second clock that generates a second clock signal that cycles at a frequency that is different from a frequency of the first clock signal; a circuit board; a first set of clock vias communicatively coupled to the first clock and coupled to the circuit board; a second set of clock vias communicatively coupled to the second clock and coupled to the circuit board in a linear pattern adjacent to the first set of clock vias, the second set of clock vias comprising at least four clock vias; at least one ground via coupled to the circuit board in line with the second set of clock vias, wherein a total number of ground vias coupled to the circuit board is less than a total number of clock vias coupled to the circuit board; wherein each ground via coupled to the circuit board, including the at least one ground via, is positioned outside any region of the circuit board located between the first and second sets of clock vias.

18. The system of claim 17, further comprising:
- a first clock buffer that is coupled to the circuit board and that transmits the first clock signal from the first clock to the first set of clock vias;
- a second clock buffer that is coupled to the circuit board and that transmits the second clock signal from the second clock to the second set of clock vias.

19. The system of claim 17, wherein:
- the first set of clock vias comprise a first clock via that transmits a first copy of the first clock signal and a second clock via that transmits a second copy of the first clock signal;
- a phase of the second copy of the first clock signal is offset 180 degrees from a phase of the first copy of the first clock signal;
- the second set of clock vias comprise a third clock via and a fourth clock via that each transmit a first copy of the second clock signal and a fifth clock via and a sixth clock via that each transmit a second copy of the second clock signal;
- a phase of the second copy of the second clock signal is offset 180 degrees from a phase of the first copy of the second clock signal.

20. The system of claim 17, wherein:
- the first set of clock vias comprises a plurality of clock vias that are coupled to the circuit board in a linear pattern;
- the linear pattern of the first set of clock vias is at least substantially parallel to the linear pattern of the second set of clock vias.

* * * * *